United States Patent
McFarlane, Jr. et al.

(10) Patent No.: US 12,281,975 B2
(45) Date of Patent: Apr. 22, 2025

(54) OPTICAL SENSOR FOR TWO-PHASE COOLING VAPOR LEVEL MEASUREMENT

(71) Applicant: Microsoft Technology Licensing, LLC, Redmond, WA (US)

(72) Inventors: Robert Craig McFarlane, Jr., Sammamish, WA (US); Craig Steven Ranta, Olympia, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 383 days.

(21) Appl. No.: 17/837,412

(22) Filed: Jun. 10, 2022

(65) Prior Publication Data

US 2023/0400398 A1   Dec. 14, 2023

(51) Int. Cl.
G01N 15/06       (2024.01)
G01N 15/075      (2024.01)
H05K 7/20        (2006.01)

(52) U.S. Cl.
CPC ............ *G01N 15/06* (2013.01); *H05K 7/203* (2013.01); *G01N 15/075* (2024.01)

(58) Field of Classification Search
CPC .... G01N 15/06; G01N 15/075; G01N 21/314; G01N 2201/0668; G01N 2201/1296; G01N 21/3504; H05K 7/203
USPC ....................................... 356/435
See application file for complete search history.

(56) References Cited

U.S. PATENT DOCUMENTS

| | | | | |
|---|---|---|---|---|
| 2010/0134881 A1* | 6/2010 | Lippert | ................ | G02B 21/33 359/381 |
| 2010/0285206 A1* | 11/2010 | Woelk | ................ | C23C 16/4482 118/667 |
| 2015/0300273 A1* | 10/2015 | Hunter | ................ | F02D 41/0027 250/343 |
| 2015/0351290 A1* | 12/2015 | Shedd | ................ | H05K 7/20809 361/679.47 |
| 2019/0250525 A1* | 8/2019 | Komaki | ................ | G03F 9/7088 |

(Continued)

FOREIGN PATENT DOCUMENTS

WO   2018141752 A1   8/2018
WO   2021231768 A1   11/2021

OTHER PUBLICATIONS

"Black-Body Curves", Retrieved from: https://www.hamamatsu.com/eu/en/resources/interactive-tools/black-body-urves.html, Retrieved Date: Apr. 20, 2022, 4 Pages.

"Blazed grating", Retrieved from: https://en.wikipedia.org/wiki/Blazed_grating, Sep. 25, 2021, 3 Pages.

(Continued)

*Primary Examiner* — Md M Rahman
(74) *Attorney, Agent, or Firm* — RAY QUINNEY & NEBEKER P.C.; Paul N. Taylor

(57) ABSTRACT

An immersion cooling system includes an immersion tank defining an immersion chamber therein, an immersion working fluid, an energy source, an optical sensor, and a microcontroller. The immersion working fluid is positioned at least partially in the immersion chamber and the immersion working fluid has a liquid phase and a vapor phase. The energy source is positioned and oriented to direct an infrared beam through a portion of the vapor phase with a beam path and path length. The optical sensor is positioned in the beam path. The microcontroller is configured to determine vapor concentration in the immersion chamber based at least partially on data from the path length, the optical sensor, and the energy source.

19 Claims, 6 Drawing Sheets

(56) References Cited

U.S. PATENT DOCUMENTS

2021/0219455 A1    7/2021  Lau
2021/0231903 A1*   7/2021  Henriksen ................ G02B 7/02

OTHER PUBLICATIONS

"PYD 1388, PYD 1398 Dual-Element Pyros", Retrieved from: https://web.archive.org/web/20200919091150/https://www.excelitas.com/product/pyd-1388-pyd-1398-dual-element-pyros, Sep. 19, 2020, 2 Pages.

"International Search Report and Written Opinion issued in PCT Application No. PCT/US23/022297", Mailed Date: Jul. 13, 2023, 10 Pages.

* cited by examiner

OPTICAL SENSOR FOR TWO-PHASE COOLING VAPOR LEVEL MEASUREMENT

BACKGROUND

Background and Relevant Art

Computing devices can generate a large amount of heat during use Immersion cooling allows the temperature of the computing devices and components to be regulated by an immersion fluid. In two-phase immersion cooling, a portion of the immersion working fluid is vaporized by heat generated by the computing devices. Sudden changes in power consumption and heat generation by the computing devices can create associated rapid changes in vapor pressure in the immersion cooling system.

BRIEF SUMMARY

In some embodiments, an immersion cooling system includes an immersion tank defining an immersion chamber therein, an immersion working fluid, an energy source, an optical sensor, and a microcontroller. The immersion working fluid is positioned at least partially in the immersion chamber and the immersion working fluid has a liquid phase and a vapor phase. The energy source is positioned and oriented to direct an infrared beam through a portion of the vapor phase with a beam path and path length. The optical sensor is positioned in the beam path. The microcontroller is configured to determine vapor concentration in the immersion chamber based at least partially on data from the path length, the optical sensor, and the energy source.

In some embodiments, an immersion cooling system includes an immersion tank defining an immersion chamber therein, an immersion working fluid, an energy source, a first optical sensor, an optical element, a second optical sensor, and a microcontroller. The immersion working fluid is positioned at least partially in the immersion chamber and the immersion working fluid has a liquid phase and a vapor phase. The energy source is positioned and oriented to direct an infrared beam through a portion of the vapor phase with a beam path and path length. The first optical sensor is positioned and oriented to direct a first infrared beam through a first portion of the vapor phase with a first beam path and first path length. The optical element is configured to direct at least a portion of the first infrared beam in a second beam path and a second path length through a second portion of the vapor phase. The second optical sensor is positioned in the second beam path. The microcontroller is configured to determine vapor concentration in the immersion chamber based at least partially on data from the first path length, the first optical sensor, the second path length, the second optical sensor, and the energy source.

In some embodiments, a method of measuring a vapor concentration in an immersion cooling system includes positioning a sample portion of an immersion working fluid in a sampling region between an energy source and an optical sensor, providing an infrared beam through the sample portion with a beam path and a path length, receiving a transmitted portion of the infrared beam with the optical sensor, measuring an intensity of the transmitted portion relative to a source portion of the infrared beam, and determining a concentration of a vapor phase of the immersion working fluid in the sample portion.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

Figure 1:
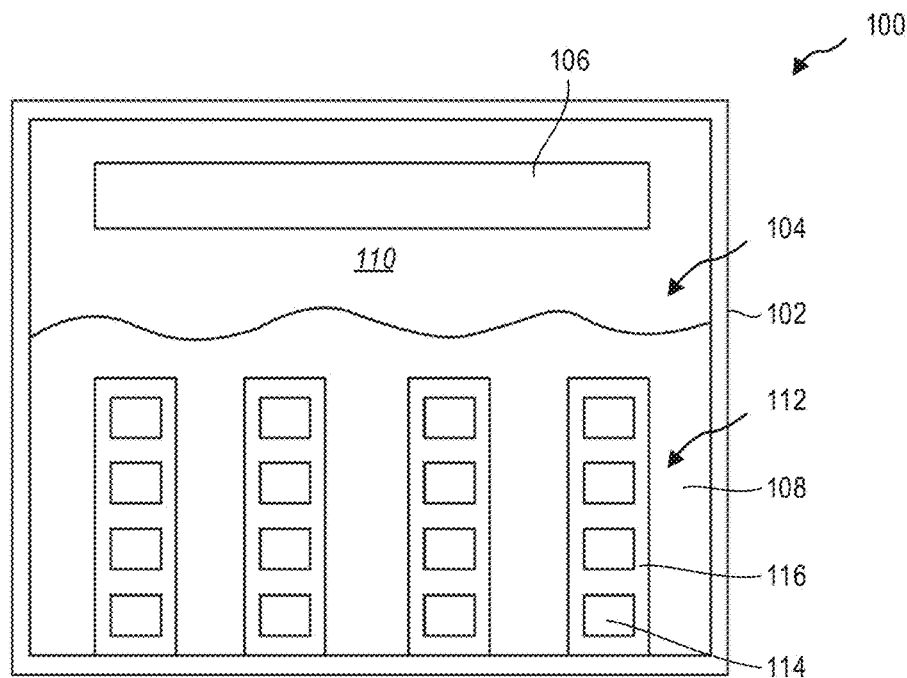
FIG. 1 is a schematic representation of an immersion cooling system, according to at least one embodiment of the present disclosure.

The present disclosure relates generally to systems and methods for thermal management of electronic devices or other heat-generating components. More particularly, the present disclosure relates to systems and methods of detecting pressure changes in an immersion cooling system. For example, immersion cooling systems use an immersion working fluid that receives heat from computing devices, electronic components, and other heat-generating components. The immersion working fluid then transports the heat to a heat exchanger to exhaust the heat from the immersion cooling system.

In some examples, the quantity of heat generated by the computing devices changes more rapidly than the heat exchanger can compensate for the change. More particularly, the increase in vaporization of the immersion working fluid near or contacting the heat-generating components of the computing devices can cause an associated increase in pressure in the immersion cooling system before the heat exchanger or condenser can exhaust the heat and condense the vapor phase of the immersion working fluid back to a liquid phase of the immersion working fluid. Similarly, a decrease in vaporization of the immersion working fluid near or contacting the heat-generating components of the computing devices can cause an associated decrease in pressure in the immersion cooling system because the heat exchanger or condenser continues to condense the vapor phase of the immersion working fluid back to a liquid phase of the immersion working fluid after the rate of vaporization decreases.

One or more sensors and/or control services according to the present disclosure can measure changes in vapor concentration in a headspace of an immersion chamber or another portion of the immersion cooling system. The vapor level in the headspace and/or vapor concentration in the headspace is a leading indicator before a substantial pressure change in the immersion cooling system. Conventional immersion tanks and conduits of immersion cooling systems are constructed to withstand pressure differentials between the immersion cooling system and the ambient atmosphere. By predicting and responding more quickly to pressure changes in the immersion cooling system, the reliability and/or operational lifetime of the immersion cooling system may be improved.

In some embodiments, the immersion working fluid is a two-phase working fluid that receives heat from the heat-generating components by vaporizing. For example, immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of vaporization.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
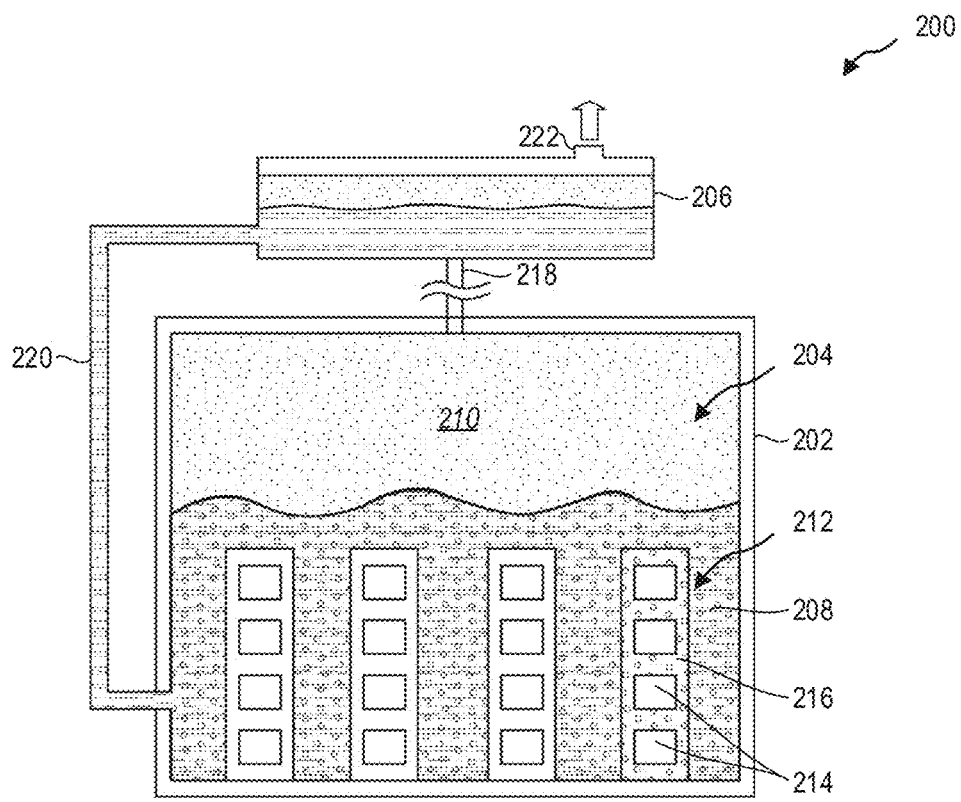
FIG. 2 is a schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is selected based at least partially on one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiently receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return conduit 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, which allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less than about 90° C. at 1 atmosphere of pressure. In some embodiments, the boiling temperature of the immersion working fluid is less than about 80° C. at 1 atmosphere of pressure. In some embodiments, the boiling temperature of the immersion working fluid is less than about 70° C. at 1 atmosphere of pressure. In some embodiments, the boiling temperature of the immersion working fluid is less than about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FK-649 vapor, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. It should be understood that while the present disclosure will describe the use of sensors with FK-649 two-phase immersion working fluid, the systems and methods described herein are applicable to other immersion working fluids.

In some embodiments, sensors according to the present disclosure detect and/or measure the presence of a vapor phase of one or more immersion working fluids in the immersion cooling system. In some embodiments, the immersion working fluid is a two-phase working fluid that boils during operations of the immersion cooling system. In some embodiments, the immersion working fluid has a vapor phase that is heavier than other gases in the immersion chamber, and the vapor phase of the immersion working fluid may settle toward a boundary of the liquid phase of the immersion working fluid. A vapor level in the headspace of the immersion chamber may be used to measure an amount or rate of change of the amount of vapor working fluid in the immersion chamber.

Figure 3:
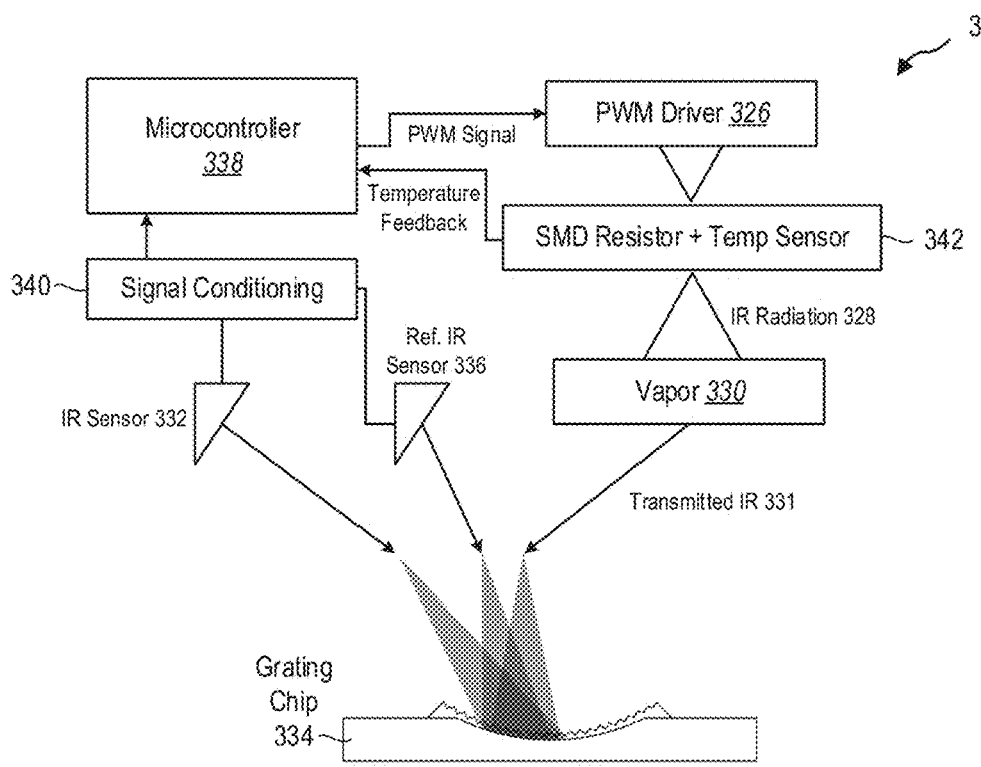
FIG. 3 is an electrical diagram of an optical sensor for measuring vapor concentrations, according to at least one embodiment of the present disclosure.

FIG. 3 is a schematic representation of an optical system 324 for measuring a vapor concentration in a sample portion of the headspace or other region of an immersion cooling system. The optical system includes an energy source 326, such as a pulse width modulation (PWM) driver, which provides an infrared beam 328. For example, the infrared beam 328 may have a spectrum with at least a portion of the spectrum in the IR range. In some examples, the infrared beam 328 may have a spectrum with a peak wavelength in the IR range. In at least one example, the infrared beam 328 may have a spectrum with a peak wavelength at 8 micrometers or between 7500 nanometers (nm) and 8500 nm.

The infrared beam 328 is provided to a vapor sample portion 330 of the vapor working fluid, and the vapor sample portion 330 absorbs at least a portion of the infrared beam such that a transmitted portion 331 of the infrared beam is transmitted therethrough. An optical sensor 332 receives the transmitted portion to measure at least one property of the transmitted portion 331, such as an intensity of the transmitted portion 331. The optical sensor 332 provides at least one measurement to a microcontroller 338 to record and/or interpret the measurement.

In some embodiments, infrared beam 328 may be directed toward the optical sensor 332 by the energy source 326. In other embodiments, at least one optical element is positioned in the beam path of the infrared beam 328 (e.g., in the transmitted portion 331) to change a direction of the infrared beam 328 toward the optical sensor 332. For example, an optical grating 334, a mirror, a beam splitter, or other optical element may direct the infrared beam 328 toward the optical sensor 332. In at least one embodiment, an optical grating 334 directs a first portion of the infrared beam 328 toward the optical sensor 332 and a second portion of the infrared beam 328 toward a reference sensor 336. For example, the optical grating 334 splits the infrared beam 328 into a first portion with a first wavelength (which may be at or near an absorption peak of the vapor working fluid) and a second portion of the infrared beam with a second wavelength that is not as strongly absorbed by the vapor working fluid in the vapor sample portion 330. A difference between the measurements at the optical sensor 332 and the reference sensor 336 may allow a microcontroller 338 to normalize the measurement at the optical sensor 332.

In some embodiments, a signal conditioner 340 is positioned between the optical sensor 332 and the microcontroller 338. In some embodiments, a signal conditioner 340 is positioned between the reference sensor 336 and the microcontroller 338. In some embodiments, the signal conditioner 340 receives information from both the optical sensor 332 and the reference sensor 336 before transmitting measurements from the optical sensor 332 and the reference sensor 336 to the microcontrollers 338.

In some embodiments, the microcontroller 338 further controls the energy source 326, such as providing a PWM signal to the PWM driver of the energy source 326 to control the infrared beam emission. The emission spectrum of the energy source 326 may be related to a source temperature of the energy source, and the energy source 326 may include or be coupled to a resistor/temperature sensor 342 to control and measure a source temperature of the energy source 326. The resistor/temperature sensor 342 may be in communication with the microcontroller 338 to allow the microcontroller 338 to control a source temperature of the energy source 326 and receive information related to the source temperature of the energy source 326 during emission of the infrared beam 328.

In some embodiments, the resistor/temperature sensor 342 maintains the source temperature at no less than 90° C. In some embodiments, the resistor/temperature sensor 342 maintains the source temperature at approximately 93° C. In some embodiments, the resistor/temperature sensor 342 maintains the source temperature at least 30° C. greater than a boiling temperature of the immersion working fluid. In some embodiments, the resistor/temperature sensor 342 maintains the source temperature at least 40° C. greater than a boiling temperature of the immersion working fluid. The temperature difference between the liquid phase of the immersion working fluid and source temperature reduces noise and/or interference from the heat of the immersion working fluid at the optical sensor.

Figure 4:
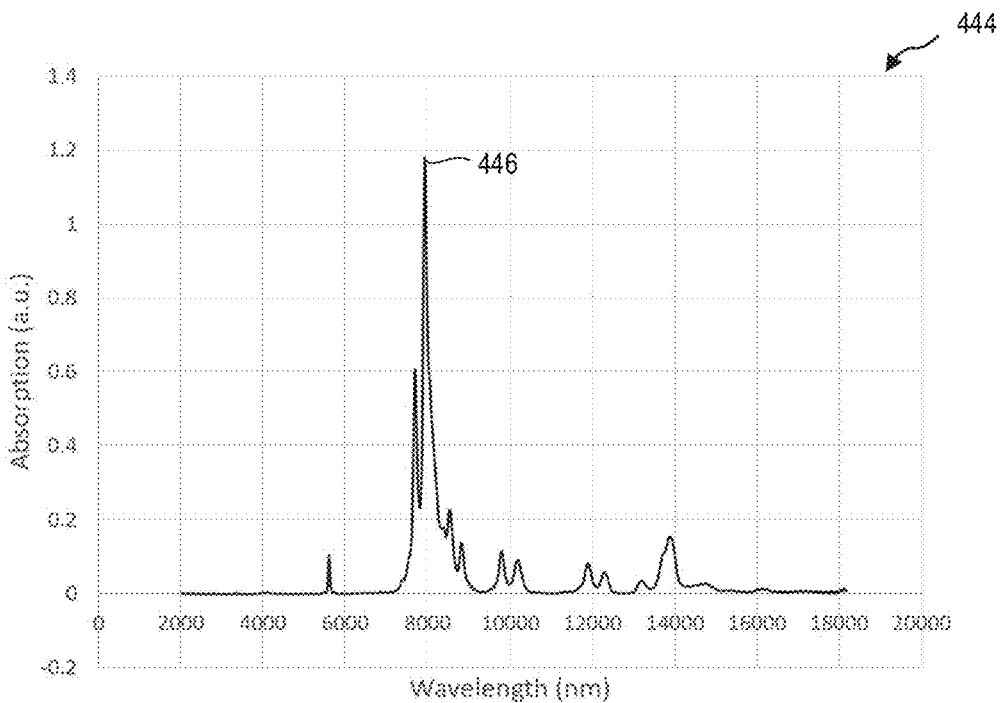
FIG. 4 is an example absorption spectrum for an immersion working fluid that may be measured by the optical sensor of FIG. 3, according to at least one embodiment of the present disclosure.

As described herein, it may be beneficial to provide an infrared beam with a peak wavelength at or near a peak absorption of the vapor working fluid to increase contrast in the signal of the absorption by the vapor working fluid. FIG. 4 is an example absorption spectrum 444 for a vapor phase of an immersion working fluid, such as FK-649. The peak absorption wavelength 446 of the vapor working fluid, in some embodiments, is approximately 8 micrometers. In some embodiments, an energy source emits an infrared beam including energy in the 8-micrometer range. In at least one embodiment, the energy source emits a infrared beam with a peak emission wavelength at 8 micrometers or between 7500 nanometers (nm) and 8500 nm. The optical sensor is sensitive to infrared energy in at or near 8 micrometers (e.g., between 7500 nm and 8500 nm) to receive the transmitted portion of the infrared beam. The microcontroller may compare at least one property (e.g., intensity) of the transmitted portion of the infrared beam received at the optical sensor to a known value of the at least one property of source portion of the infrared beam provided by the energy source.

In some embodiments, multiple values for the at least one property for the transmitted portion and the source portion of the infrared beam are provided to the microcontroller. In some embodiments, the multiple values are captured over time to track and/or correlate the values for the at least one property for the transmitted portion and the source portion relative to vapor level/concentration. A machine learning (ML) model may be trained based on known vapor levels and/or vapor concentrations of one or more vapor working fluids to allow the ML model to recognize or calculate pressure changes based at least partially on the vapor level, the vapor concentration, rates of changes of the vapor level or concentrations, or combinations thereof.

Figure 5:
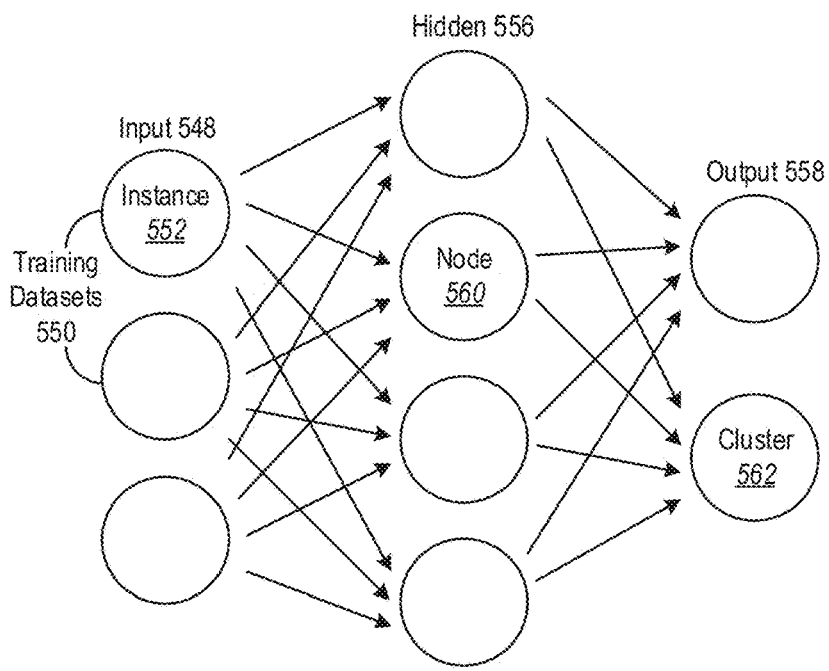
FIG. 5 is a schematic diagram of a machine learning model, according to at least one embodiment of the present disclosure.

FIG. 5 is a schematic representation of an ML model that may be used with one or more embodiments of systems and methods described herein. As used herein, a "machine learning model" refers to a computer algorithm or model (e.g., a classification model, a regression model, a language model, an object detection model) that can be tuned (e.g., trained) based on training input to approximate unknown functions. For example, an ML model may refer to a neural network or other machine learning algorithm or architecture that learns and approximates complex functions and generate outputs based on a plurality of inputs provided to the machine learning model. In some embodiments, an ML system, model, or neural network described herein is an artificial neural network. In some embodiments, an ML system, model, or neural network described herein is a convolutional neural network. In some embodiments, an ML system, model, or neural network described herein is a recurrent neural network. In at least one embodiment, an ML system, model, or neural network described herein is a Bayes classifier. As used herein, a "machine learning system" may refer to one or multiple ML models that cooperatively generate one or more outputs based on corresponding inputs. For example, an ML system may refer to any system architecture having multiple discrete ML components that consider different kinds of information or inputs.

As used herein, an "instance" refers to an input object that may be provided as an input to an ML system to use in generating an output, such as a species of vapor working fluid present, a concentration of vapor working fluid present, or a rate of change of a vapor working fluid present. For example, an instance may refer to any event in which the vapor working fluid is present. For example, a first absorption measurement or other measurement received at the microcontroller may be related to a first vapor working fluid being present in the sample portion of the vapor working fluid. In another example, a second absorption measurement or other measurement received at the microcontroller may be related to a second vapor working fluid being present in the sample portion of the immersion working fluid. In another example, a change in the absorption measurement or other measurement received at the microcontroller may be related to an increasing concentration of a vapor working fluid in the sample portion.

In some embodiments, the machine learning system has a plurality of layers with an input layer 548 configured to receive at least one input training dataset 550 or input training instance 552 and an output layer 558, with a plurality of additional or hidden layers 556 therebetween. The training datasets can be input into the ML system to train the ML system and identify individual and combinations of vapor working fluid or other attributes of the training instances that allow the microcontroller to identify concentrations of known or unknown vapor working fluids.

In some embodiments, the machine learning system can receive multiple training datasets concurrently and learn from the different training datasets simultaneously.

In some embodiments, the machine learning system includes a plurality of machine learning models that operate together. Each of the machine learning models has a plurality of hidden layers between the input layer and the output layer. The hidden layers have a plurality of input nodes (e.g., nodes 560), where each of the nodes operates on the received inputs from the previous layer. In a specific example, a first hidden layer has a plurality of nodes and each of the nodes performs an operation on each instance from the input layer. Each node of the first hidden layer provides a new input into each node of the second hidden layer, which, in turn, performs a new operation on each of those inputs. The nodes of the second hidden layer then passes outputs, such as identified clusters 562, to the output layer.

In some embodiments, each of the nodes 560 has a linear function and an activation function. The linear function may attempt to optimize or approximate a solution with a line of best fit. The activation function operates as a test to check the validity of the linear function. In some embodiments, the activation function produces a binary output that determines whether the output of the linear function is passed to the next layer of the machine learning model. In this way, the machine learning system can limit and/or prevent the propagation of poor fits to the data and/or non-convergent solutions.

The machine learning model includes an input layer that receives at least one training dataset. In some embodiments, at least one machine learning model uses supervised training. In some embodiments, at least one machine learning model uses unsupervised training. Unsupervised training can be used to draw inferences and find patterns or associations from the training dataset(s) without known outputs. In some embodiments, unsupervised learning can identify clusters of similar labels or characteristics for a variety of training instances and allow the machine learning system to extrapolate the performance of instances with similar characteristics.

In some embodiments, semi-supervised learning can combine benefits from supervised learning and unsupervised learning. As described herein, the machine learning system can identify associated labels (such as known vapor working fluid or concentrations of vapor working fluid) or characteristic between instances, which may allow a training dataset with known outputs and a second training dataset including more general input information to be fused. Unsupervised training can allow the machine learning system to cluster the instances from the second training dataset without known outputs and associate the clusters with known outputs from the first training dataset.

Figure 6:
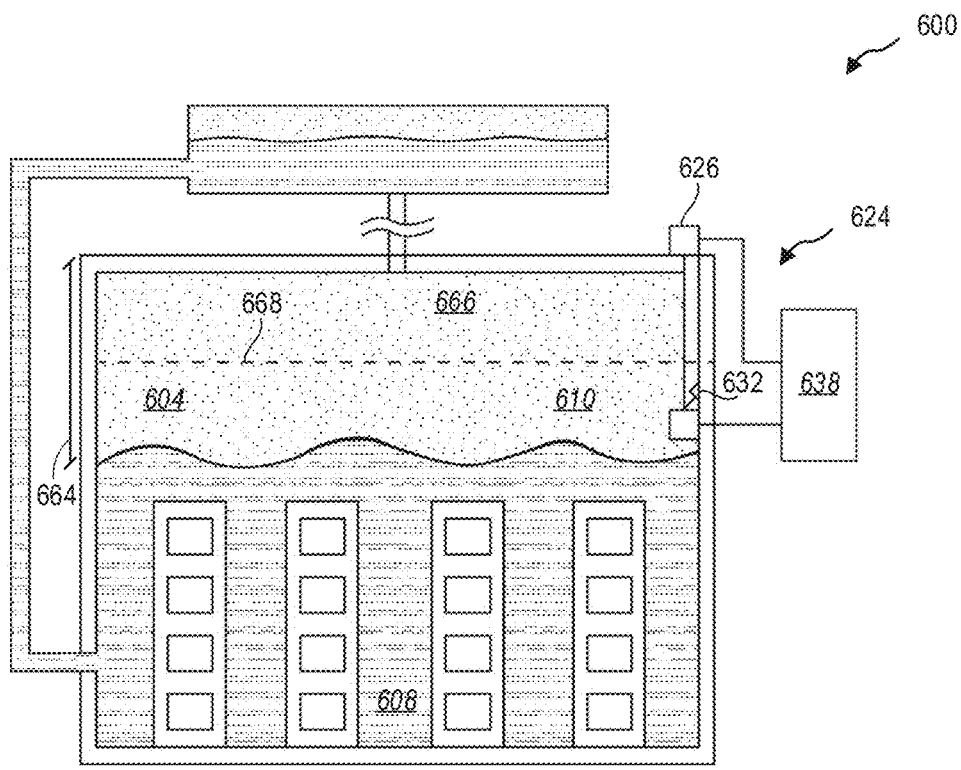
FIG. 6 is a schematic representation of an immersion cooling system with a vertical optical sensor, according to at least one embodiment of the present disclosure.

FIG. 6 is a system diagram of an immersion cooling system 600 with an optical system 624 including at least an energy source 626 and an optical sensor 632 in communication with a microcontroller 638. In some embodiments, the optical system 624 has a beam path that is substantially vertical in a headspace 664 of the immersion chamber 604. The vapor working fluid 610 is located in the headspace 664 above the liquid working fluid 608.

In some embodiments, the headspace 664 includes air 666 or other gas and vapor working fluid 610. As described herein, the vapor working fluid 610 may be heavier than the air 666 or other gases in the headspace 664. In some embodiments, the air/vapor interface 668 is not a well-defined boundary. For example, there may be a vapor concentration gradient that is highest at the interface with the liquid working fluid 608 and decreases as you rise vertically above the liquid working fluid 608. A beam path through this gradient may measure a total path loss that is greater when a higher vapor level is present and a total path loss that is less when a lower vapor level.

For example, a vapor concentration level may be calculated by the Beer-Lambert law:

$$A = \varepsilon L c$$

Where A=amount of energy absorbed by a substance at a specific wavelength; $\varepsilon$=molar extinction coefficient or absorption coefficient for the substance at a specific wavelength; L=the path length the energy travels through the substance; and c=the concentration of the substance. Therefore, for thin cross sections in the vertical direction:

$$dA = \varepsilon (dL)(dc/dL)$$

The total path loss will be:

$$A = \varepsilon L \int (dc/dL)$$

In some embodiments, a plurality of optical systems 624 at different vertical positions in the headspace 664 may be used to measure the vapor concentration in the headspace with different beam paths and/or path lengths through the headspace 664. In some embodiments, an optical system may include at least one optical element to create a plurality of beam paths with different beam lengths and/or at different vertical positions in the headspace.

Figure 7:
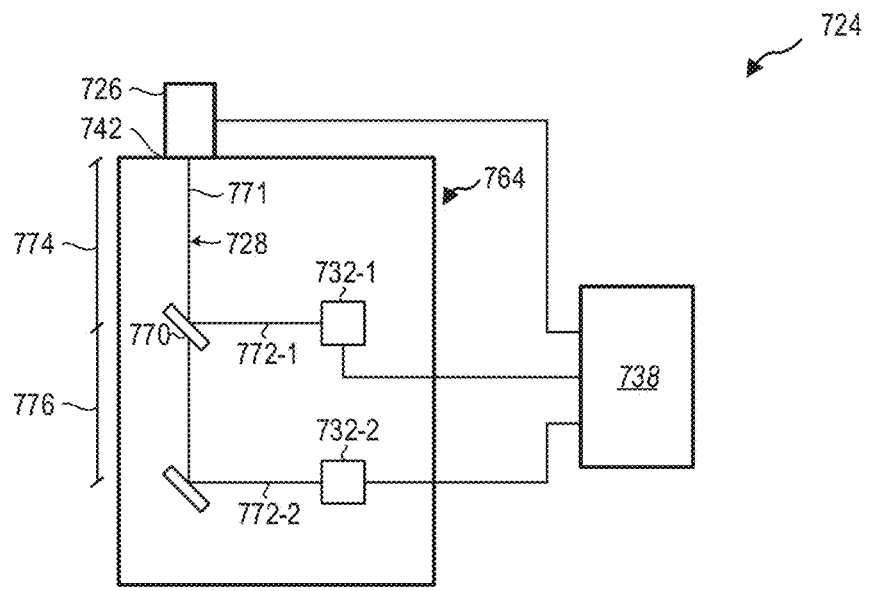
FIG. 7 is a side view of an optical sensor including a plurality of beam paths, according to at least one embodiment of the present disclosure.

FIG. 7 is a side view of an embodiment of an optical system 724 with a beam splitter 770 that divides an infrared beam 728. In some embodiments, the optical system 724 includes an energy source 726 including a resistor 742 that provides an infrared beam 728 in a headspace 764. The infrared beam 728 begins with a shared path 771 before a beam splitter 770 divides the beam path into a first beam path 772-1 directed toward a first optical sensor 732-1 and a second beam path 772-2 directed toward a second optical sensor 732-2. In some embodiments, the first beam path 772-1 and second beam path 772-2 have different path lengths. In some embodiments, the first beam path 772-1 and second beam path 772-2 have substantially equal path lengths.

In some embodiments, the shared path 771 and first beam path 772-1 sample a first vertical portion 774 of the headspace 764 and the shared path 771 and second beam path 772-2 sample a second vertical portion 776 of the headspace 764. For example, the first vertical portion 774 and the second vertical portion 776 are positioned at different vertical positions in the headspace 764. In some embodiments, the first vertical portion 774 and the second vertical portion 776 have different vertical lengths. In some embodiments, the first vertical portion 774 and the second vertical portion 776 have substantially equal vertical lengths.

The first optical sensor 732-1 and second optical sensor 732-2 may provide one or more measurements to the microcontroller 738. In some embodiments, the microcontroller 738 may obtain or have information stored thereon regarding the relative path lengths and/or positions of the shared path 771, the first beam path 772-1, and second beam path 772-2. The microcontroller 738 may, therefore, determine the vapor levels in the headspace 764.

While embodiments of optical systems are described herein with a substantially vertical beam path, in other embodiments, the beam path may be oriented at other angles in the headspace to sample the vapor working fluid therein. For example, a plurality of optical systems, such as that described in relation to FIG. 3, may be oriented with horizontal beam paths and positioned at a series of discrete vertical positions to sample the vapor working fluid at the series of discrete vertical positions. In another example, a beam path may be oriented diagonally to increase the path length and increase the absorption of the infrared beam by the vapor working fluid. In other examples, the beam path may be directed through a plurality of optical elements (prisms, mirrors, etc.) to further extend the path length.

Figure 8:
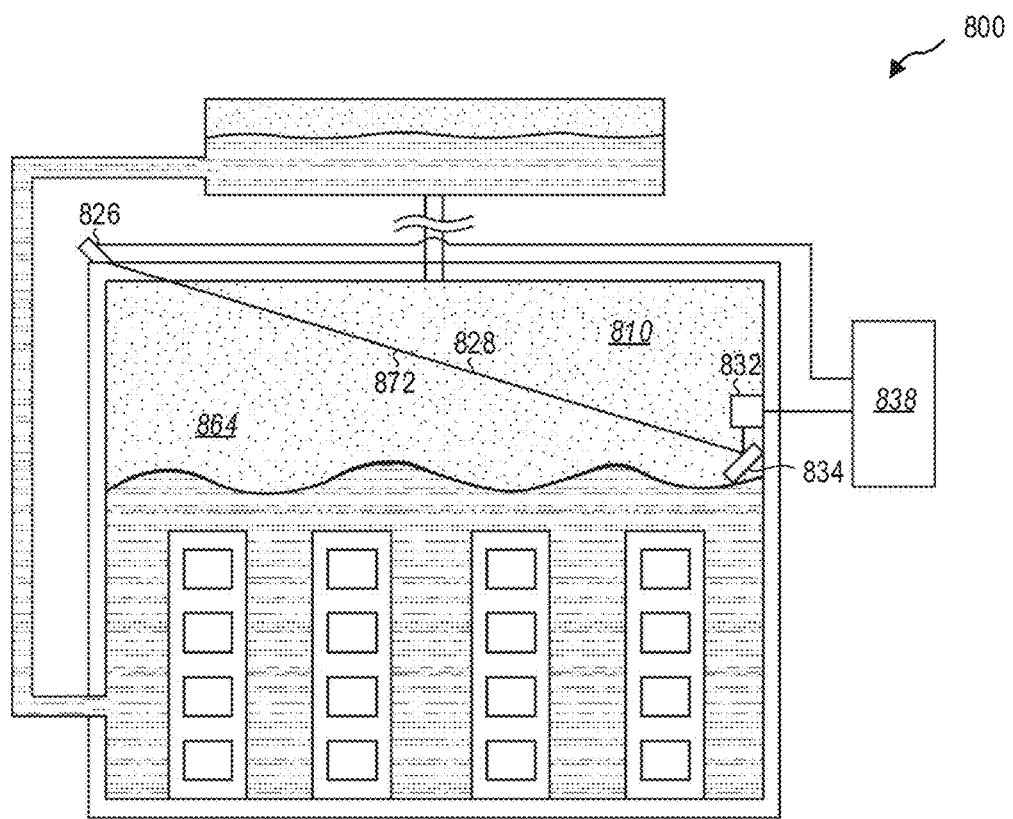
FIG. 8 is a schematic representation of an immersion cooling system with a diagonal optical sensor, according to at least one embodiment of the present disclosure.

FIG. 8 is a system diagram of an embodiment of an immersion cooling system 800 including an optical system 824 with a diagonal beam path 872. In some embodiments, a diagonal beam path 872 between an energy source 826 and an optical sensor 832 (which may include a grating 834 or other optical element therebetween) in communication with a microcontroller 838, the infrared beam 828 may experience greater attenuation through the vapor working fluid 810 in the headspace 864 than a substantially vertical beam path.

Figure 9:
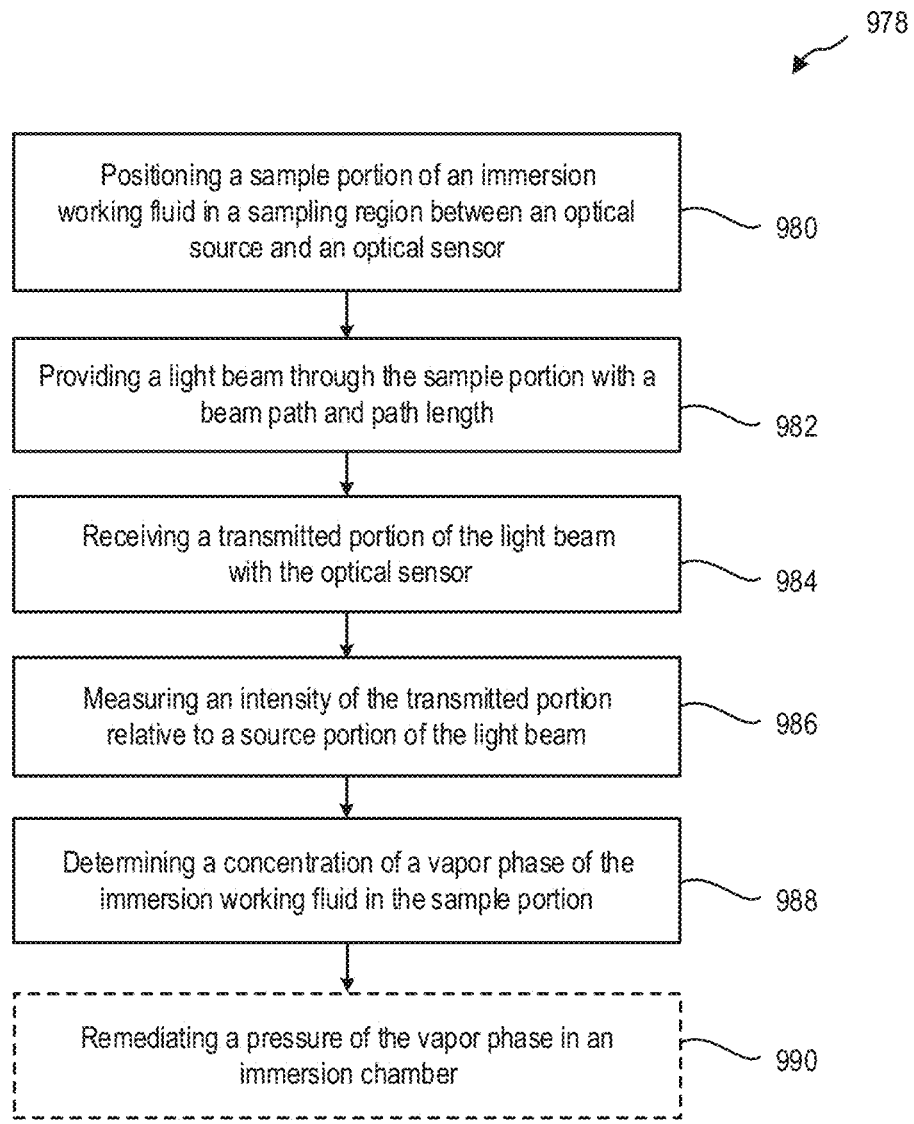
FIG. 9 is a flowchart illustrating a method of measuring a vapor concentration in an immersion cooling system, according to at least one embodiment of the present disclosure.

FIG. 9 is a flowchart illustrating an embodiment of a method 978 of measuring a vapor level and/or concentration in an immersion cooling system. The method 978 includes positioning a sample portion of an immersion working fluid in a sampling region between an energy source and an optical sensor at 980 and providing an infrared beam through the sample portion with a beam path and a path length at 982. The method 978 further includes receiving a transmitted portion of the infrared beam with the optical sensor at 984 and measuring an intensity of the transmitted portion relative to a source portion of the infrared beam at 986. In some embodiments, the energy source and/or infrared beam is any of the energy sources or infrared beams described herein. For example, the infrared beam may be an IR infrared beam.

In some embodiments, the source portion of the infrared beam is a portion of the infrared beam proximate the energy source that is emitted from the energy source with a known intensity and/or wavelength. The transmitted portion of the infrared beam is the portion of the infrared beam proximate the optical sensor, which has at least part of the infrared beam absorbed and/or attenuated by the vapor phase of the immersion working fluid in the sample portion.

The method 978 further includes determining a concentration of a vapor phase of the immersion working fluid in the sample portion at 988. For example, determining the concentration may include providing a measured intensity to a microcontroller and calculating the concentration with the microcontroller. In other examples, the concentration may be calculated elsewhere. In at least one example, the concentration is calculated at least partially based on the Beer-Lambert law. In at least one example, the concentration is determined by inputting the measured intensity into an ML system.

In some embodiments, the method 978 optionally includes remediating a pressure of the vapor phase in an immersion chamber at 990. For example, remediating a pressure of the vapor phase may include automatically venting at least a portion of the vapor pressure from the immersion cooling system, such as from the immersion tank or via a vent (e.g., a remediation feature) in a condenser of the immersion cooling system.

In another example, remediating a pressure of the vapor phase may include automatically adding cool immersion working fluid (e.g., at least 1° C. below a boiling temperature of the immersion working fluid) to the immersion cooling system, such as opening a valve to add cool immersion working fluid to the immersion cooling system, to reduce a temperature of the liquid working fluid to reduce a vaporization rate of the immersion working fluid. In at least one embodiment, adding cool immersion working fluid to the immersion cooling system includes opening a valve to allow the cool immersion working fluid to flow from a reservoir through the valve into the immersion cooling system. For example, the valve may be controlled by the microcontroller, and the microcontroller may open the valve at least partially based on the determined concentration of vapor phase.

In yet another example, remediating a pressure of the vapor phase may include automatically replacing hot immersion working fluid (e.g., at or near the boiling temperature of the immersion working fluid) with cool immersion working fluid. Replacing hot immersion working fluid with a cool immersion working fluid may include opening at least a first valve to drain a portion of the hot immersion working fluid from the immersion cooling system and opening at least a second valve to allow cool immersion working fluid to flow from a reservoir through the valve into the immersion cooling system. In at least one embodiment, the valves may be controlled by the microcontroller, and the microcontroller may open the valves at least partially based on the determined concentration of vapor phase.

Figure 10:
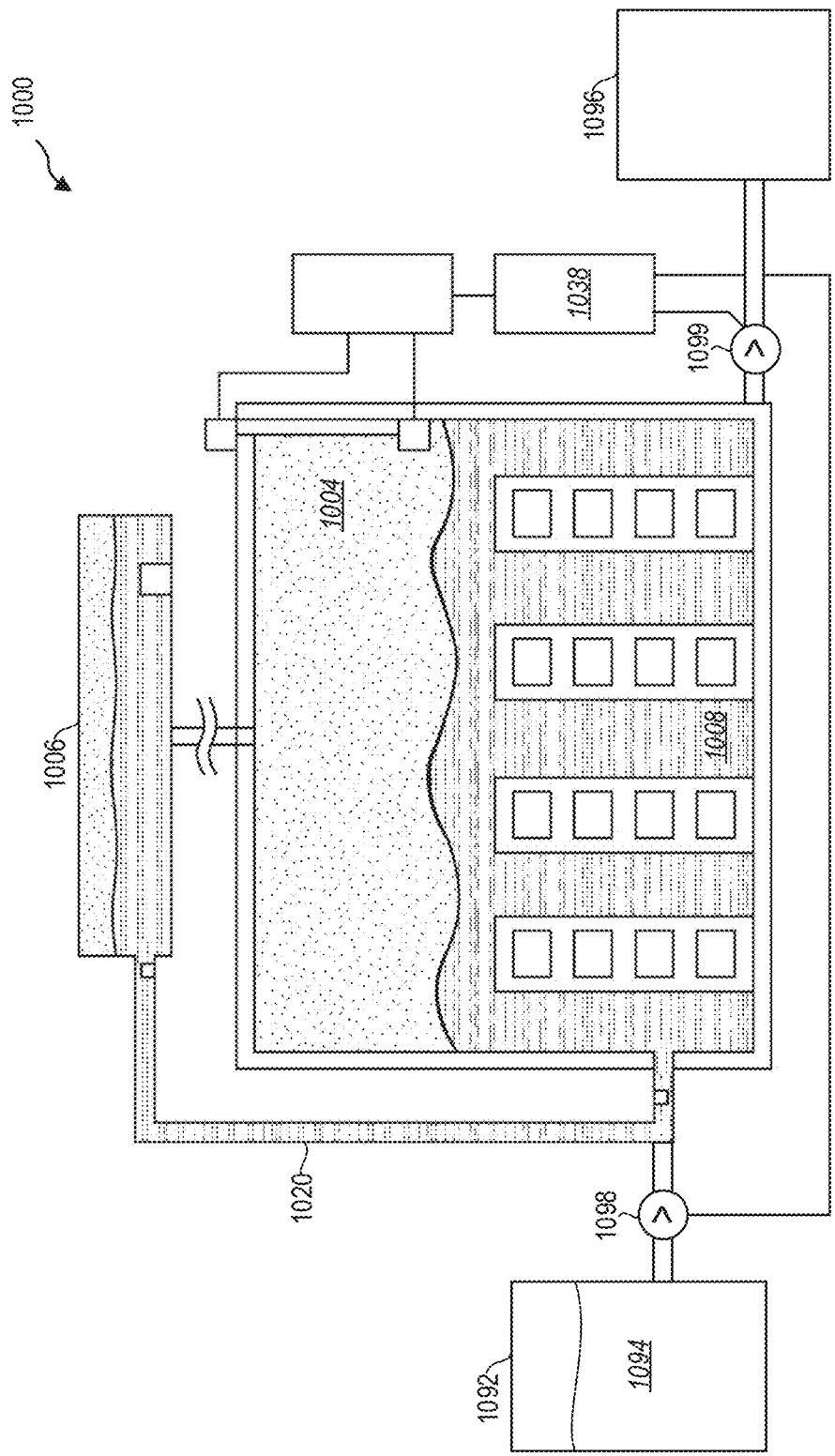
FIG. 10 is a schematic representation of an immersion cooling system with pressure remediation features, according to at least one embodiment of the present disclosure.

FIG. 10 is a system diagram of an immersion cooling system 1000 with an optical system 1024 in communication with one or more remediation features. For example, the immersion cooling system 1000 may include a reservoir 1092 containing a cool immersion working fluid 1094 and a collection tank 1096 configured to capture at least a portion of the hot liquid working fluid 1008. In some embodiments, the reservoir 1092 is connected to the return conduit 1020 or other inlet to the immersion chamber 1004 to introduce the cool immersion working fluid 1094 into the immersion chamber 1004. In other examples, the reservoir 1092 may be connected to the immersion chamber 1004 directly or by a dedicated conduit, or the reservoir 1092 may be connected to the condenser 1006 to deliver the cool immersion working fluid 1094 into the immersion cooling system 1000 via the condenser 1006.

In some embodiments, a first valve 1098 (e.g., a first remediation feature) that controls a flow of the cool immersion working fluid 1094 into the immersion cooling system 1000. The first valve 1098 may be controlled by the microcontroller 1038. In other embodiments, the first valve 1098 may be controlled by another control plane that receives vapor level and/or vapor concentration information from the microcontroller 1038.

A collection tank 1096 may be connected to the immersion cooling system 1000 by a second valve 1099 (e.g., a second remediation feature). In some embodiments, the collection tank 1096 is connected to the return conduit 1020 or other conduit of the immersion chamber 1004 to receive hot liquid working fluid 1008 from the immersion chamber 1004. In other examples, the collection tank 1096 may be connected to the immersion chamber 1004 directly or by a dedicated conduit, or the collection tank 1096 may be connected to the condenser 1006 to receive the hot liquid working fluid 1008 from the immersion cooling system 1000 via the condenser 1006. While FIG. 10 illustrates an embodiment of an immersion cooling system 1000 with a collection tank 1096 positioned and configured to receive hot liquid working fluid 1008, in some embodiments, a collection tank 1096 is positioned and configured to receive vapor working fluid 1010 through a vent (e.g., a third remediation feature) in communication with the immersion chamber, condenser 1006, or another portion of the immersion cooling system 1000.

In some embodiments, the second valve 1099 controls a flow of the hot liquid working fluid 1008 from the immersion cooling system 1000. The second valve 1099 may be controlled by the microcontroller 1038. In other embodiments, the second valve 1099 may be controlled by another control plane that receives vapor level and/or vapor concentration information from the microcontroller 1038. In at least one embodiment, the microcontroller 1038 or other control plane opens the first valve 1098 and the second valve 1099 at least partially simultaneously (e.g., a period of time when the first valve 1098 is open at least partially overlaps a period of time when the second valve 1099 is open) to introduce cool immersion working fluid 1094 into the immersion cooling system 1000 from the reservoir 1092 while at least a portion of the hot liquid working fluid 1008 is removed into the collection tank 1096.

INDUSTRIAL APPLICABILITY

The present disclosure relates generally to systems and methods for thermal management of electronic devices or other heat-generating components. More particularly, the present disclosure relates to systems and methods of detecting pressure changes in an immersion cooling system. For example, immersion cooling systems use an immersion working fluid that receives heat from computing devices, electronic components, and other heat-generating components. The immersion working fluid then transports the heat to a heat exchanger to exhaust the heat from the immersion cooling system.

In some examples, the quantity of heat generated by the computing devices changes more rapidly than the heat exchanger can compensate for the change. More particularly, the increase in vaporization of the immersion working fluid near or contacting the heat-generating components of the computing devices can cause an associated increase in pressure in the immersion cooling system before the heat exchanger or condenser can exhaust the heat and condense the vapor phase of the immersion working fluid back to a liquid phase of the immersion working fluid. Similarly, a decrease in vaporization of the immersion working fluid near or contacting the heat-generating components of the computing devices can cause an associated decrease in pressure in the immersion cooling system because the heat exchanger or condenser continues to condense the vapor phase of the immersion working fluid back to a liquid phase of the immersion working fluid after the rate of vaporization decreases.

One or more sensors and/or control services according to the present disclosure can measure changes in vapor concentration in a headspace of an immersion chamber or another portion of the immersion cooling system. The vapor level in the headspace and/or vapor concentration in the headspace is a leading indicator before a substantial pressure change in the immersion cooling system. Conventional immersion tanks and conduits of immersion cooling systems are constructed to withstand pressure differentials between the immersion cooling system and the ambient atmosphere. By predicting and responding more quickly to pressure changes in the immersion cooling system, the reliability and/or operational lifetime of the immersion cooling system may be improved.

In some embodiments, the immersion working fluid is a two-phase working fluid that receives heat from the heat-generating components by vaporizing. For example, immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system includes an immersion tank containing an immersion chamber and a condenser in the immersion chamber. The immersion chamber contains an immersion working fluid that has a liquid working fluid and a vapor working fluid portion. The liquid working fluid creates an immersion bath in which a plurality of heat-generating components are positioned to heat the liquid working fluid on supports.

In some embodiments, an immersion cooling system includes an immersion tank defining an immersion chamber with an immersion working fluid positioned therein. An immersion working fluid in the immersion tank has a boiling temperature that is selected at least partially based on one or more operating properties of the immersion cooling system, the electronic components and/or computing devices in the immersion tank, computational or workloads of the electronic components and/or computing devices in the immersion tank, external and/or environmental conditions, or other properties that affect the operation of the immersion cooling system.

In some embodiments, the immersion working fluid transitions between a liquid working fluid phase and a vapor working fluid phase to remove heat from hot or heat-generating components in the immersion chamber. The liquid working fluid more efficiency receives heat from the heat-generating components and, upon transition to the vapor working fluid, the vapor working fluid can be removed from the immersion tank, cooled and condensed by the condenser (or other heat exchanger) to extract the heat from the working fluid, and the liquid working fluid can be returned to the liquid immersion bath.

In some embodiments, the immersion bath of the liquid working fluid has a plurality of heat-generating components positioned in the liquid working fluid. The liquid working fluid surrounds at least a portion of the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the liquid working fluid may remove heat through convective cooling.

In some embodiments, the heat-generating components include electronic or computing components or power supplies. In some embodiments, the heat-generating components include computer devices, such as individual personal computer or server blade computers. In some embodiments, one or more of the heat-generating components includes a heat sink or other device attached to the heat-generating component to conduct away thermal energy and effectively increase the surface area of the heat-generating component. In some embodiments, the heat sink of the heat-generating component is a vapor chamber with one or more three-dimensional structures to increase surface area.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor working fluid rises in the liquid working fluid, the vapor working fluid can be extracted from the immersion chamber in an upper vapor region of the chamber. A condenser cools part of the vapor working fluid back into a liquid working fluid, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system for thermal management of computing devices allows at least one immersion tank and/or chamber to be connected to and in fluid communication with an external condenser. In some embodiments, an immersion cooling system includes a vapor return line that connects the immersion tank to the condenser and allows vapor working fluid to enter the condenser from the immersion tank and/or chamber and a liquid return conduit that connects the immersion tank to the condenser and allows liquid working fluid to return to the immersion tank and/or chamber.

The vapor return line may be colder than the boiling temperature of the working fluid. In some embodiments, a portion of the vapor working fluid condenses in the vapor return line. The vapor return line can, in some embodiments, be oriented at an angle such that the vapor return line is non-perpendicular to the direction of gravity. The condensed working fluid can then drain either back to the immersion tank or forward to the condenser depending on the direction of the vapor return line slope. In some embodiments, the vapor return line includes a liquid collection line or valve, like a bleeder valve, which allows the collection and/or return of the condensed working fluid to the immersion tank or condenser.

In some examples, an immersion cooling system includes an air-cooled condenser. An air-cooled condenser may require fans or pumps to force ambient air over one or more heat pipes or fins to conduct heat from the condenser to the air. In some embodiments, the circulation of immersion working fluid through the immersion cooling system causes liquid working fluid to flow past one or more heat-generating components. In the example of a heat-generating component with a vapor chamber heat sink, the dynamics of liquid working fluid may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less than about 90° C. at 1 atmosphere of pressure. In some embodiments, the boiling temperature of the immersion working fluid is less than about 80° C. at 1 atmosphere of pressure. In some embodiments, the boiling temperature of the immersion working fluid is less than about 70° C. at 1 atmosphere of pressure. In some embodiments, the boiling temperature of the immersion working fluid is less than about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FK-649 vapor, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. It should be understood that while the present disclosure will describe the use of sensors with FK-649 two-phase immersion working fluid, the systems and methods described herein are applicable to other immersion working fluids.

In some embodiments, sensors according to the present disclosure detect and/or measure the presence of a vapor phase of one or more immersion working fluids in the immersion cooling system. In some embodiments, the immersion working fluid is a two-phase working fluid that boils during operations of the immersion cooling system. In some embodiments, the immersion working fluid has a vapor phase that is heavier than other gases in the immersion chamber, and the vapor phase of the immersion working fluid may settle toward a boundary of the liquid phase of the immersion working fluid. A vapor level in the headspace of the immersion chamber may be used to measure an amount or rate of change of the amount of vapor working fluid in the immersion chamber.

In some embodiments, an optical system for measuring a vapor concentration in a sample portion of the headspace or other region of an immersion cooling system includes an energy source, such as a pulse width modulation (PWM) driver, which provides an infrared beam. In some embodiments, the infrared beam is an infrared (IR) infrared beam. For example, the infrared beam may have a spectrum with at least a portion of the spectrum in the IR range. In some examples, the infrared beam may have a spectrum with a peak wavelength in the IR range. In at least one example, the infrared beam may have a spectrum with a peak wavelength at 8 micrometers or between 7500 nanometers (nm) and 8500 nm.

The infrared beam is provided to a vapor sample portion of the vapor working fluid, and the vapor sample portion absorbs at least a portion of the infrared beam such that a transmitted portion of the infrared beam is transmitted therethrough. An optical sensor receives the transmitted portion to measure at least one property of the transmitted portion, such as an intensity of the transmitted portion. The optical sensor provides at least one measurement to a microcontroller to record and/or interpret the measurement.

In some embodiments, infrared beam may be directed toward the optical sensor by the energy source. In other embodiments, at least one optical element is positioned in the beam path of the infrared beam (e.g., in the transmitted portion) to change a direction of the infrared beam toward the optical sensor. For example, an optical grating, a mirror, a beam splitter, or other optical element may direct the infrared beam toward the optical sensor. In at least one embodiment, an optical grating directs a first portion of the infrared beam toward the optical sensor and a second portion of the infrared beam toward a reference sensor. For example, the optical grating splits the infrared beam into a first portion with a first wavelength (which may be at or near an absorption peak of the vapor working fluid) and a second portion of the infrared beam with a second wavelength that is not as strongly absorbed by the vapor working fluid in the vapor sample portion 330. A difference between the measurements at the optical sensor and the reference sensor may allow a microcontroller to normalize the measurement at the optical sensor.

In some embodiments, a signal conditioner is positioned between the optical sensor and the microcontroller. In some embodiments, a signal conditioner is positioned between the reference sensor and the microcontroller. In some embodiments, the signal conditioner receives information from both the optical sensor and the reference sensor before transmitting measurements from the optical sensor and the reference sensor to the microcontrollers.

In some embodiments, the microcontroller further controls the energy source, such as providing a PWM signal to the PWM driver of the energy source to control the infrared beam emission. The emission spectrum of the energy source may be related to a source temperature of the energy source, and the energy source may include or be coupled to a resistor/temperature sensor to control and measure a source temperature of the energy source. The resistor/temperature sensor may be in communication with the microcontroller to allow the microcontroller to control a source temperature of the energy source and receive information related to the source temperature of the energy source during emission of the infrared beam.

In some embodiments, the resistor/temperature sensor maintains the source temperature at no less than 90° C. In some embodiments, the resistor/temperature sensor maintains the source temperature at approximately 93° C. In some embodiments, the resistor/temperature sensor maintains the source temperature at least 30° C. greater than a boiling temperature of the immersion working fluid. In some embodiments, the resistor/temperature sensor maintains the source temperature at least 40° C. greater than a boiling temperature of the immersion working fluid. The temperature difference between the liquid phase of the immersion working fluid and source temperature reduces noise and/or interference from the heat of the immersion working fluid at the optical sensor.

As described herein, it may be beneficial to provide an infrared beam with a peak wavelength at or near a peak absorption of the vapor working fluid to increase contrast in the signal of the absorption by the vapor working fluid. The peak absorption wavelength of the vapor working fluid, in some embodiments, is approximately 8 micrometers. In some embodiments, an energy source emits an infrared beam including light in the 8-micrometer range. In at least one embodiment, the energy source emits a infrared beam with a peak emission wavelength at 8 micrometers or between 7500 nanometers (nm) and 8500 nm. The optical sensor is sensitive to light in at or near 8 micrometers (e.g., between 7500 nm and 8500 nm) to receive the transmitted portion of the infrared beam. The microcontroller may compare at least one property (e.g., intensity) of the transmitted portion of the infrared beam received at the optical sensor to a known value of the at least one property of source portion of the infrared beam provided by the energy source.

In some embodiments, multiple values for the at least one property for the transmitted portion and the source portion of the infrared beam are provided to the microcontroller. In some embodiments, the multiple values are captured over time to track and/or correlate the values for the at least one property for the transmitted portion and the source portion relative to vapor level/concentration. A machine learning (ML) model may be trained based on known vapor levels and/or vapor concentrations of one or more vapor working fluids to allow the ML model to recognize or calculate pressure changes based at least partially on the vapor level, the vapor concentration, rates of changes of the vapor level or concentrations, or combinations thereof.

As used herein, a "machine learning model" refers to a computer algorithm or model (e.g., a classification model, a regression model, a language model, an object detection model) that can be tuned (e.g., trained) based on training input to approximate unknown functions. For example, an ML model may refer to a neural network or other machine learning algorithm or architecture that learns and approximates complex functions and generate outputs based on a plurality of inputs provided to the machine learning model.

In some embodiments, an ML system, model, or neural network described herein is an artificial neural network. In some embodiments, an ML system, model, or neural network described herein is a convolutional neural network. In some embodiments, an ML system, model, or neural network described herein is a recurrent neural network. In at least one embodiment, an ML system, model, or neural network described herein is a Bayes classifier. As used herein, a "machine learning system" may refer to one or multiple ML models that cooperatively generate one or more outputs based on corresponding inputs. For example, an ML system may refer to any system architecture having multiple discrete ML components that consider different kinds of information or inputs.

As used herein, an "instance" refers to an input object that may be provided as an input to an ML system to use in generating an output, such as a species of vapor working fluid present, a concentration of vapor working fluid present, or a rate of change of a vapor working fluid present. For example, an instance may refer to any event in which the vapor working fluid is present. For example, a first absorption measurement or other measurement received at the microcontroller may be related to a first vapor working fluid being present in the sample portion of the vapor working fluid. In another example, a second absorption measurement or other measurement received at the microcontroller may be related to a second vapor working fluid being present in the sample portion of the immersion working fluid. In another example, a change in the absorption measurement or other measurement received at the microcontroller may be related to an increasing concentration of a vapor working fluid in the sample portion.

In some embodiments, the machine learning system has a plurality of layers with an input layer configured to receive at least one input training dataset or input training instance and an output layer, with a plurality of additional or hidden layers therebetween. The training datasets can be input into the ML system to train the ML system and identify individual and combinations of vapor working fluid or other attributes of the training instances that allow the microcontroller to identify concentrations of known or unknown vapor working fluids.

In some embodiments, the machine learning system can receive multiple training datasets concurrently and learn from the different training datasets simultaneously.

In some embodiments, the machine learning system includes a plurality of machine learning models that operate together. Each of the machine learning models has a plurality of hidden layers between the input layer and the output layer. The hidden layers have a plurality of input nodes, where each of the nodes operates on the received inputs from the previous layer. In a specific example, a first hidden layer has a plurality of nodes and each of the nodes performs an operation on each instance from the input layer. Each node of the first hidden layer provides a new input into each node of the second hidden layer, which, in turn, performs a new operation on each of those inputs. The nodes of the second hidden layer then passes outputs, such as identified clusters, to the output layer.

In some embodiments, each of the nodes has a linear function and an activation function. The linear function may attempt to optimize or approximate a solution with a line of best fit. The activation function operates as a test to check the validity of the linear function. In some embodiments, the activation function produces a binary output that determines whether the output of the linear function is passed to the next layer of the machine learning model. In this way, the machine learning system can limit and/or prevent the propagation of poor fits to the data and/or non-convergent solutions.

The machine learning model includes an input layer that receives at least one training dataset. In some embodiments, at least one machine learning model uses supervised training. In some embodiments, at least one machine learning model uses unsupervised training. Unsupervised training can be used to draw inferences and find patterns or associations from the training dataset(s) without known outputs. In some embodiments, unsupervised learning can identify clusters of similar labels or characteristics for a variety of training instances and allow the machine learning system to extrapolate the performance of instances with similar characteristics.

In some embodiments, semi-supervised learning can combine benefits from supervised learning and unsupervised learning. As described herein, the machine learning system can identify associated labels (such as known vapor working fluid or concentrations of vapor working fluid) or characteristic between instances, which may allow a training dataset with known outputs and a second training dataset including more general input information to be fused. Unsupervised training can allow the machine learning system to cluster the instances from the second training dataset without known outputs and associate the clusters with known outputs from the first training dataset.

In some embodiments, an immersion cooling system with an optical system includes at least an energy source and an optical sensor in communication with a microcontroller. In some embodiments, the optical system has a beam path that is substantially vertical in a headspace of the immersion chamber. The vapor working fluid is located in the headspace above the liquid working fluid.

In some embodiments, the headspace includes air or other gas and vapor working fluid. As described herein, the vapor working fluid may be heavier than the air or other gases in the headspace. In some embodiments, the air/vapor interface is not a well-defined boundary. For example, there may be a vapor concentration gradient that is highest at the interface with the liquid working fluid and decreases as you rise vertically above the liquid working fluid. A beam path through this gradient may measure a total path loss that is greater when a higher vapor level is present and a total path loss that is less when a lower vapor level.

For example, a vapor concentration level may be calculated by the Beer-Lambert law:

$$A = \varepsilon L c$$

Where A=amount of energy absorbed by a substance at a specific wavelength; $\varepsilon$=molar extinction coefficient or absorption coefficient for the substance at a specific wavelength; L=the path length the energy travels through the substance; and c=the concentration of the substance. Therefore, for thin cross sections in the vertical direction:

$$dA = \varepsilon (dL)(dc/dL)$$

The total path loss will be:

$$A = \varepsilon L \smallint (dc/dL)$$

In some embodiments, a plurality of optical systems at different vertical positions in the headspace may be used to measure the vapor concentration in the headspace with different beam paths and/or path lengths through the headspace. In some embodiments, an optical system may include at least one optical element to create a plurality of beam paths with different beam lengths and/or at different vertical positions in the headspace.

In some embodiments, an optical system has a beam splitter that divides an infrared beam. In some embodiments, the optical system includes an energy source that provides an infrared beam in a headspace. The infrared beam begins with a shared path before a beam splitter divides the beam path into a first beam path directed toward a first optical sensor and a second beam path directed toward a second optical sensor. In some embodiments, the first beam path and second beam path have different path lengths. In some embodiments, the first beam path and second beam path have substantially equal path lengths.

In some embodiments, the shared path and first beam path sample a first vertical portion of the headspace and the shared path, and second beam path sample a second vertical portion of the headspace. For example, the first vertical portion and the second vertical portion are positioned at different vertical positions in the headspace. In some embodiments, the first vertical portion and the second vertical portion have different vertical lengths. In some embodiments, the first vertical portion and the second vertical portion have substantially equal vertical lengths.

The first optical sensor and second optical sensor may provide one or more measurements to the microcontroller. In some embodiments, the microcontroller may obtain or have information stored thereon regarding the relative path lengths and/or positions of the shared path, the first beam path, and second beam path. The microcontroller may, therefore, determine the vapor levels in the headspace.

While embodiments of optical systems are described herein with a substantially vertical beam path, in other embodiments, the beam path may be oriented at other angles in the headspace to sample the vapor working fluid therein. For example, a plurality of optical systems, such as that described herein, may be oriented with horizontal beam paths and positioned at a series of discrete vertical positions to sample the vapor working fluid at the series of discrete vertical positions. In another example, a beam path may be oriented diagonally to increase the path length and increase the absorption of the infrared beam by the vapor working fluid. In other examples, the beam path may be directed through a plurality of optical elements (prisms, mirrors, etc.) to further extend the path length.

In some embodiments, an immersion cooling system includes an optical system with a diagonal beam path. In some embodiments, a diagonal beam path between an energy source and an optical sensor (which may include a grating or other optical element therebetween) in communication with a microcontroller, the infrared beam may experience greater attenuation through the vapor working fluid in the headspace than a substantially vertical beam path.

In some embodiments, a method of measuring a vapor level and/or concentration in an immersion cooling system includes positioning a sample portion of an immersion working fluid in a sampling region between an energy source and an optical sensor and providing an infrared beam through the sample portion with a beam path and a path length. The method further includes receiving a transmitted portion of the infrared beam with the optical sensor and measuring an intensity of the transmitted portion relative to a source portion of the infrared beam. In some embodiments, the energy source and/or infrared beam is any of the energy sources or infrared beams described herein. For example, the infrared beam may be an IR infrared beam.

In some embodiments, the source portion of the infrared beam is a portion of the infrared beam proximate the energy source that is emitted from the energy source with a known intensity and/or wavelength. The transmitted portion of the infrared beam is the portion of the infrared beam proximate the optical sensor, which has at least part of the infrared beam absorbed and/or attenuated by the vapor phase of the immersion working fluid in the sample portion.

The method further includes determining a concentration of a vapor phase of the immersion working fluid in the sample portion. For example, determining the concentration may include providing a measured intensity to a microcontroller and calculating the concentration with the microcontroller. In other examples, the concentration may be calculated elsewhere. In at least one example, the concentration is calculated at least partially based on the Beer-Lambert law. In at least one example, the concentration is determined by inputting the measured intensity into an ML system.

In some embodiments, the method optionally includes remediating a pressure of the vapor phase in an immersion chamber. For example, remediating a pressure of the vapor phase may include automatically venting at least a portion of the vapor pressure from the immersion cooling system, such as from the immersion tank or via a vent in a condenser of the immersion cooling system.

In another example, remediating a pressure of the vapor phase may include automatically adding cool immersion working fluid (e.g., at least 1° C. below a boiling temperature of the immersion working fluid) to the immersion cooling system, such as opening a valve to add cool immersion working fluid to the immersion cooling system, to reduce a temperature of the liquid working fluid to reduce a vaporization rate of the immersion working fluid. In at least one embodiment, adding cool immersion working fluid to the immersion cooling system includes opening a valve to allow the cool immersion working fluid to flow from a reservoir through the valve into the immersion cooling system. For example, the valve may be controlled by the microcontroller, and the microcontroller may open the valve at least partially based on the determined concentration of vapor phase.

In yet another example, remediating a pressure of the vapor phase may include automatically replacing hot immersion working fluid (e.g., at or near the boiling temperature of the immersion working fluid) with cool immersion working fluid. Replacing hot immersion working fluid with a cool immersion working fluid may include opening at least a first valve to drain a portion of the hot immersion working fluid from the immersion cooling system and opening at least a second valve to allow cool immersion working fluid to flow from a reservoir through the valve into the immersion cooling system. In at least one embodiment, the valves may be controlled by the microcontroller, and the microcontroller may open the valves at least partially based on the determined concentration of vapor phase.

In some embodiments, an immersion cooling system has an optical system in communication with one or more remediation features. For example, the immersion cooling system may include a reservoir containing a cool immersion working fluid and a collection tank configured to capture at least a portion of the hot liquid working fluid. In some embodiments, the reservoir is connected to the return conduit or other inlet to the immersion chamber to introduce the cool immersion working fluid into the immersion chamber. In other examples, the reservoir may be connected to the immersion chamber directly or by a dedicated conduit, or the reservoir may be connected to the condenser to deliver the cool immersion working fluid into the immersion cooling system via the condenser.

In some embodiments, a first valve controls a flow of the cool immersion working fluid into the immersion cooling system. The first valve may be controlled by the microcontroller. In other embodiments, the first valve may be controlled by another control plane that receives vapor level and/or vapor concentration information from the microcontroller.

A collection tank may be connected to the immersion cooling system by a second valve. In some embodiments, the collection tank is connected to the return conduit or other conduit of the immersion chamber to receive hot liquid working fluid from the immersion chamber. In other examples, the collection tank may be connected to the immersion chamber directly or by a dedicated conduit, or the collection tank may be connected to the condenser to receive the hot liquid working fluid from the immersion cooling system via the condenser. In some embodiments, a collection tank is positioned and configured to receive vapor working fluid through a vent in communication with the immersion chamber, condenser, or another portion of the immersion cooling system.

In some embodiments, the second valve controls a flow of the hot liquid working fluid from the immersion cooling system. The second valve may be controlled by the microcontroller. In other embodiments, the second valve may be controlled by another control plane that receives vapor level and/or vapor concentration information from the microcontroller. In at least one embodiment, the microcontroller or other control plane opens the first valve and the second valve at least partially simultaneously (e.g., a period of time when the first valve is open at least partially overlaps a period of time when the second valve is open) to introduce cool immersion working fluid into the immersion cooling system from the reservoir while at least a portion of the hot liquid working fluid is removed into the collection tank.

The present disclosure relates to systems and methods for cooling heat-generating components of a computer or computing device according to at least the examples provided in the sections below:

[A1] In some embodiments, an immersion cooling system includes an immersion tank defining an immersion chamber therein, an immersion working fluid, an energy source, an optical sensor, and a microcontroller. The immersion working fluid is positioned at least partially in the immersion chamber and the immersion working fluid has a liquid phase and a vapor phase. The energy source is positioned and oriented to direct an infrared beam through a portion of the vapor phase with a beam path and path length. The optical sensor is positioned in the beam path. The microcontroller is configured to determine vapor concentration in the immersion chamber based at least partially on data from the path length, the optical sensor, and the energy source.

[A2] In some embodiments, the beam path of [A1] samples the vapor phase in a vapor conduit in fluid communication with the immersion chamber.

[A3] In some embodiments, the beam path of [A1] samples the vapor phase in a headspace of the immersion chamber.

[A4] In some embodiments, an optical grating is configured to direct a first portion of the infrared beam of any of [A1] through [A3] toward the optical sensor.

[A5] In some embodiments, the optical grating of [A4] is configured to direct a reference portion of the infrared beam toward a reference sensor.

[A6] In some embodiments, the energy source of any of [A1] through [A5] is configured to provide the infrared beam with a wavelength at a peak absorption of the vapor phase of the working fluid.

[A7] In some embodiments, the optical sensor of any of [A1] through [A6] measures a transmitted portion of the infrared beam at 8 micrometers.

[A8] In some embodiments, the beam path of any of [A1] through [A7] is oriented diagonally across a headspace in the immersion chamber.

[A9] In some embodiments, the beam path of any of [A1] through [A7] is oriented vertically across a headspace in the immersion chamber.

[A10] In some embodiments, the energy source of any of [A1] through [A9] includes a resistor to maintain a source temperature greater than 90° C.

[A11] In some embodiments, a difference between the source temperature of [A10] and a boiling temperature of the liquid phase of the immersion working fluid is at least 30° C.

[A12] In some embodiments, the system of any of [A1] through [A11] includes a computing device positioned in the liquid phase of the immersion working fluid.

[A13] In some embodiments, the microcontroller of any of [A1] through [A12] is configured to control at least one remediation feature.

[A14] In some embodiments, the at least one remediation feature of [A13] includes at least one valve to allow fluid communication between the immersion chamber and at least one additional fluid tank.

[B1] In some embodiments, an immersion cooling system includes an immersion tank defining an immersion chamber therein, an immersion working fluid, an energy source, a first optical sensor, an optical element, a second optical sensor, and a microcontroller. The immersion working fluid is positioned at least partially in the immersion chamber and the immersion working fluid has a liquid phase and a vapor phase. The energy source is positioned and oriented to direct an infrared beam through a portion of the vapor phase with a beam path and path length. The first optical sensor is positioned and oriented to direct a first infrared beam through a first portion of the vapor phase with a first beam path and first path length. The optical element is configured to direct at least a portion of the first infrared beam in a second beam path and a second path length through a second portion of the vapor phase. The second optical sensor is positioned in the second beam path. The microcontroller is configured to determine vapor concentration in the immersion chamber based at least partially on data from the first path length, the first optical sensor, the second path length, the second optical sensor, and the energy source.

[B2] In some embodiments, the optical element of [B1] is a beam splitter.

[B3] In some embodiments, the first portion of the vapor phase of [B1] or [B2] is located in a first vertical position in a headspace of the immersion chamber and the second portion of the vapor phase is located in a second vertical position in the headspace.

[C1] In some embodiments, a method of measuring a vapor concentration in an immersion cooling system includes positioning a sample portion of an immersion working fluid in a sampling region between an energy source and an optical sensor, providing an infrared beam through the sample portion with a beam path and a path length, receiving a transmitted portion of the infrared beam with the optical sensor, measuring an intensity of the transmitted portion relative to a source portion of the infrared beam, and determining a concentration of a vapor phase of the immersion working fluid in the sample portion.

[C2] In some embodiments, the method of [C1] includes determining a pressure change in an immersion chamber based at least partially on the concentration of the vapor phase.

[C3] In some embodiments, the method of [C2] includes automatically remediating the pressure change in the immersion chamber.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system for immersion cooling, the system comprising:
an immersion tank defining an immersion chamber therein;
an immersion working fluid positioned at least partially in the immersion chamber, the immersion working fluid having a liquid phase and a vapor phase;
an energy source positioned and oriented to direct an infrared beam through a portion of the vapor phase with a beam path and path length, wherein the beam path is oriented vertically across a headspace in the immersion chamber;
an optical sensor positioned in the beam path; and
a microcontroller configured to determine vapor concentration in the immersion chamber based at least partially on data from the path length, the optical sensor, and the energy source.

2. The system of claim 1, wherein the beam path samples the vapor phase in a vapor conduit in fluid communication with the immersion chamber.

3. The system of claim 1, wherein the beam path samples the vapor phase in a headspace of the immersion chamber.

4. The system of claim 1, further comprising an optical grating configured to direct a first portion of the infrared beam toward the optical sensor.

5. The system of claim 4, wherein the optical grating is configured to direct a reference portion of the infrared beam toward a reference sensor.

6. The system of claim 1, wherein the energy source is configured to provide the infrared beam with a wavelength at a peak absorption of the vapor phase of the working fluid.

7. The system of claim 1, wherein the optical sensor measures a transmitted portion of the infrared beam at 8 micrometers.

8. The system of claim 1, wherein the beam path is oriented diagonally across a headspace in the immersion chamber.

9. The system of claim 1, wherein the energy source includes a resistor to maintain a source temperature greater than 90° C.

10. The system of claim 9, wherein a difference between the source temperature and a boiling temperature of the liquid phase of the immersion working fluid is at least 30° C.

11. The system of claim 1, further comprising a computing device positioned in the liquid phase of the immersion working fluid.

12. The system of claim 1, wherein the microcontroller is configured to control at least one remediation feature.

13. The system of claim 12, wherein the at least one remediation feature includes at least one valve to allow fluid communication between the immersion chamber and at least one additional fluid tank.

14. A system for immersion cooling, the system comprising:
an immersion tank defining an immersion chamber therein;
an immersion working fluid positioned at least partially in the immersion chamber, the immersion working fluid having a liquid phase and a vapor phase;
a first energy source positioned and oriented to direct a first infrared beam through a first portion of the vapor phase with a first beam path and first path length;
a first optical sensor positioned in the first beam path;
an optical element configured to direct at least a portion of the first infrared beam in a second beam path and a second path length through a second portion of the vapor phase;
a second optical sensor positioned in the second beam path; and
a microcontroller configured to determine vapor concentration in the immersion chamber based at least partially on data from the first path length, the first optical sensor, the second path length, the second optical sensor, and the energy source.

15. The system of claim 14, wherein the optical element is a beam splitter.

16. The system of claim 14, wherein the first portion of the vapor phase is located in a first vertical position in a headspace of the immersion chamber and the second portion of the vapor phase is located in a second vertical position in the headspace.

17. A method of measuring a vapor concentration in an immersion cooling system, the method comprising:
positioning a sample portion of an immersion working fluid in a sampling region between an energy source and an optical sensor;
providing an infrared beam through the sample portion with a beam path and a path length, wherein the beam path is oriented vertically across a headspace in the immersion chamber;
receiving a transmitted portion of the infrared beam with the optical sensor;
measuring an intensity of the transmitted portion relative to a source portion of the infrared beam; and
determining a concentration of a vapor phase of the immersion working fluid in the sample portion.

18. The method of claim 17 further comprising determining a pressure change in an immersion chamber based at least partially on the concentration of the vapor phase.

19. The method of claim 18, further comprising automatically remediating the pressure change in the immersion chamber.

* * * * *